United States Patent
Yu et al.

(10) Patent No.: US 8,704,597 B2
(45) Date of Patent: Apr. 22, 2014

(54) AMPLIFIERS AND RELATED RECEIVER SYSTEMS

(71) Applicants: Chuanzhao Yu, Chandler, AZ (US);
Salem Eid, Chandler, AZ (US)

(72) Inventors: Chuanzhao Yu, Chandler, AZ (US);
Salem Eid, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/873,454

(22) Filed: Apr. 30, 2013

(65) Prior Publication Data

US 2013/0241651 A1    Sep. 19, 2013

Related U.S. Application Data

(62) Division of application No. 13/004,640, filed on Jan. 11, 2011, now Pat. No. 8,463,226.

(51) Int. Cl.
*H03F 3/45* (2006.01)

(52) U.S. Cl.
USPC .......................................... 330/253; 330/311

(58) Field of Classification Search
USPC .................................... 330/253, 69, 261, 311
See application file for complete search history.

(56) References Cited

U.S. PATENT DOCUMENTS

| | | | |
|---|---|---|---|
| 5,703,532 A * | 12/1997 | Shin et al. | 330/253 |
| 6,714,076 B1 | 3/2004 | Kalb | |
| 7,119,616 B2 * | 10/2006 | Benzer | 330/252 |
| 7,889,004 B1 * | 2/2011 | Murden et al. | 330/253 |
| 8,063,702 B2 * | 11/2011 | Lim | 330/253 |
| 8,242,844 B2 * | 8/2012 | Rafi | 330/277 |
| 8,339,200 B2 * | 12/2012 | Wong | 330/253 |

OTHER PUBLICATIONS

Kluge, W., et al., A Fully Integrated 2.4-GHz IEEE 802.15.4-CompliantTransceiver for ZigBee™ Applications, IEEE Journal of Solid-State Circuits, vol. 41, No. 12, Dec. 2006.

\* cited by examiner

*Primary Examiner* — Henry Choe
(74) *Attorney, Agent, or Firm* — Ingrassia Fisher & Lorenz, P.C.

(57) ABSTRACT

Apparatus are provided for amplifier circuits and related receiver systems. An amplifier circuit includes a first common-source amplification stage and a second common-source amplification stage. The input of the second common-source amplification stage is coupled to the output of the first common-source amplification stage such that the first common-source amplification stage generates a first amplified signal, and the second common-source amplification stage generates a second amplified signal based on the first amplified signal. The first common-source amplification stage is coupled to a first node and the second common-source amplification stage is coupled to a second node, wherein the common-source amplification stages are configured such that a current between the first node and the second node flows in series through the common-source amplification stages.

20 Claims, 2 Drawing Sheets

AMPLIFIERS AND RELATED RECEIVER SYSTEMS

CROSS-REFERENCE TO RELATED APPLICATIONS

This is a division of U.S. patent application Ser. No. 13/004,640, filed Jan. 11, 2011.

TECHNICAL FIELD

Embodiments of the subject matter described herein relate generally to electronic circuits, and more particularly, embodiments of the subject matter relate to amplifiers and related amplifier circuit topologies.

BACKGROUND

Amplifiers are commonly used to amplify a signal. For example, a receiver typically uses an amplifier, commonly referred to as a low-noise amplifier, to amplify an electrical signal generated by an antenna in response to induction from propagating electromagnetic waves. However, when the amount of current (or power) capable of being consumed by the amplifier is limited, it is difficult to simultaneously achieve relatively high gain and relatively low noise using conventional amplifier topologies.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Some embodiments of the subject matter described herein relate to amplifiers capable of achieving relatively low noise and relatively high gain over a relatively wide bandwidth with relatively low current consumption. As described in greater detail below, common-source transconductance amplification stages are cascaded or stacked, such that current effectively flows through the amplification stages in series. Additionally, each amplification stage has a tank circuit coupled to its output that is configured to provide a resonant frequency for the amplification stage. In this regard, the resonant frequencies are chosen to be different from one another, such that the amplifier achieves a relatively high gain across a wide bandwidth of signal frequencies to compensate for process, voltage, temperature (PVT) variations and/or component variations that may otherwise impact the performance of the amplifier.

Figure 1:
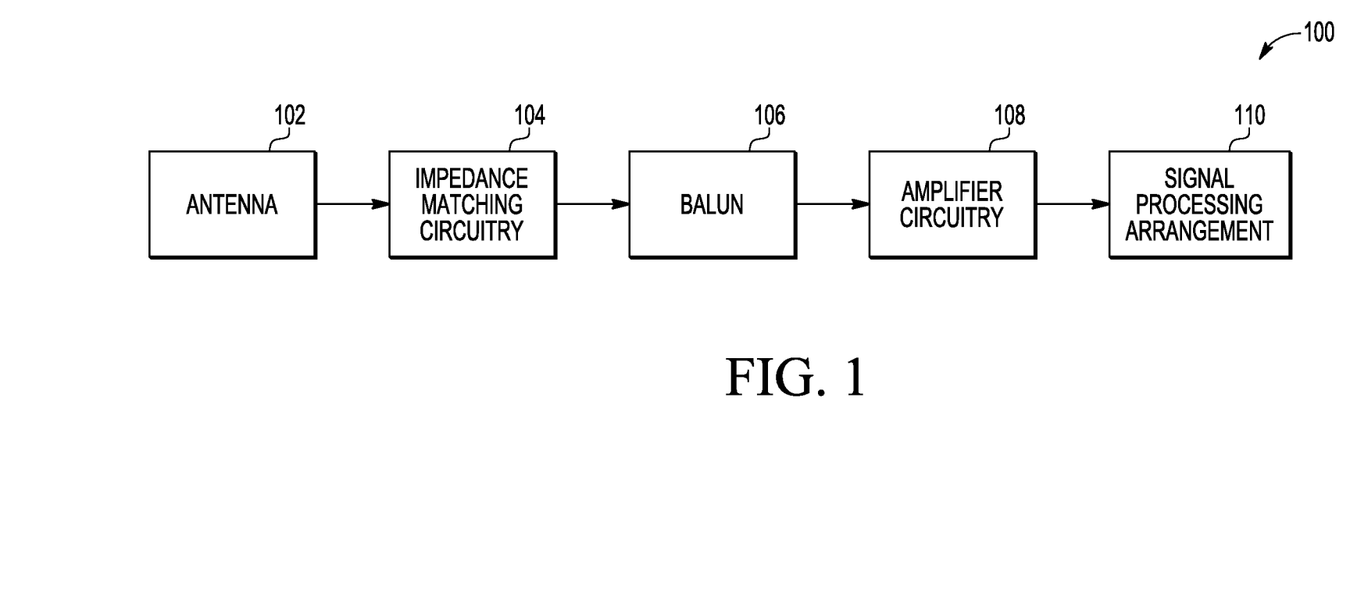
FIG. 1 is a block diagram of a receiver system in accordance with one embodiment of the invention.

FIG. 1 depicts an exemplary embodiment of a receiver system 100 including, without limitation, an antenna 102, impedance matching circuitry 104, a balun 106, amplifier circuitry 108, and a signal processing arrangement 110. It should be understood that FIG. 1 is a simplified representation of a receiver system 100 for purposes of explanation and ease of description, and that practical embodiments may include other devices and components to provide additional functions and features, and/or the receiver system 100 may be part of a much larger electrical system, as will be understood.

In an exemplary embodiment, the antenna 102 is realized as a conductive element configured to generate or otherwise produce electrical signals that are induced by electromagnetic waves propagating within range of the antenna 102. In this regard, the length of the conductive element for antenna 102 may be chosen to allow the antenna 102 to generate radio frequency (RF) electrical signals in response to RF electromagnetic waves at a carrier frequency for the receiver system 100. It will be appreciated that the carrier frequency will vary depending on the needs of a particular application, and may be specified by a communications standard that the receiver system 100 is designed for. The impedance matching circuitry 104 generally represents the combination of capacitors, inductors, and/or other components that are coupled between the antenna 102 and the downstream elements of the receiver system 100 (e.g., the balun 106, the amplifier circuitry 108, the signal processing arrangement 110, etc.), and the impedance matching circuitry 104 is configured to match the effective impedance of the downstream elements of the receiver system 100 to the impedance of the antenna 102 at the carrier frequency. The balun 106 is coupled to the impedance matching circuitry 104 and converts single-ended electrical signals generated by the antenna 102 into differential electrical signals that are provided to the input of the amplifier circuitry 108. The amplifier circuitry 108 is configured to amplify the differential electrical signals from the balun 106 to a voltage level suitable for operation with the signal processing arrangement 110. In an exemplary embodiment, the amplifier circuitry 108 is realized as a low-noise amplifier capable of achieving a gain of about 30 dB or more at the carrier frequency for the receiver system 100 with minimal noise while consuming less than 4 milliamperes (mA) of current. The signal processing arrangement 110 generally represents the hardware components and/or circuitry (e.g., mixers, demodulators, analog-to-digital converters, processors, and the like) that are configured to convert the amplified differential electrical signals at the output of the amplifier circuitry 108 from the carrier frequency into digital signals at a baseband frequency for subsequent processing, as will be appreciated in the art.

Figure 2:
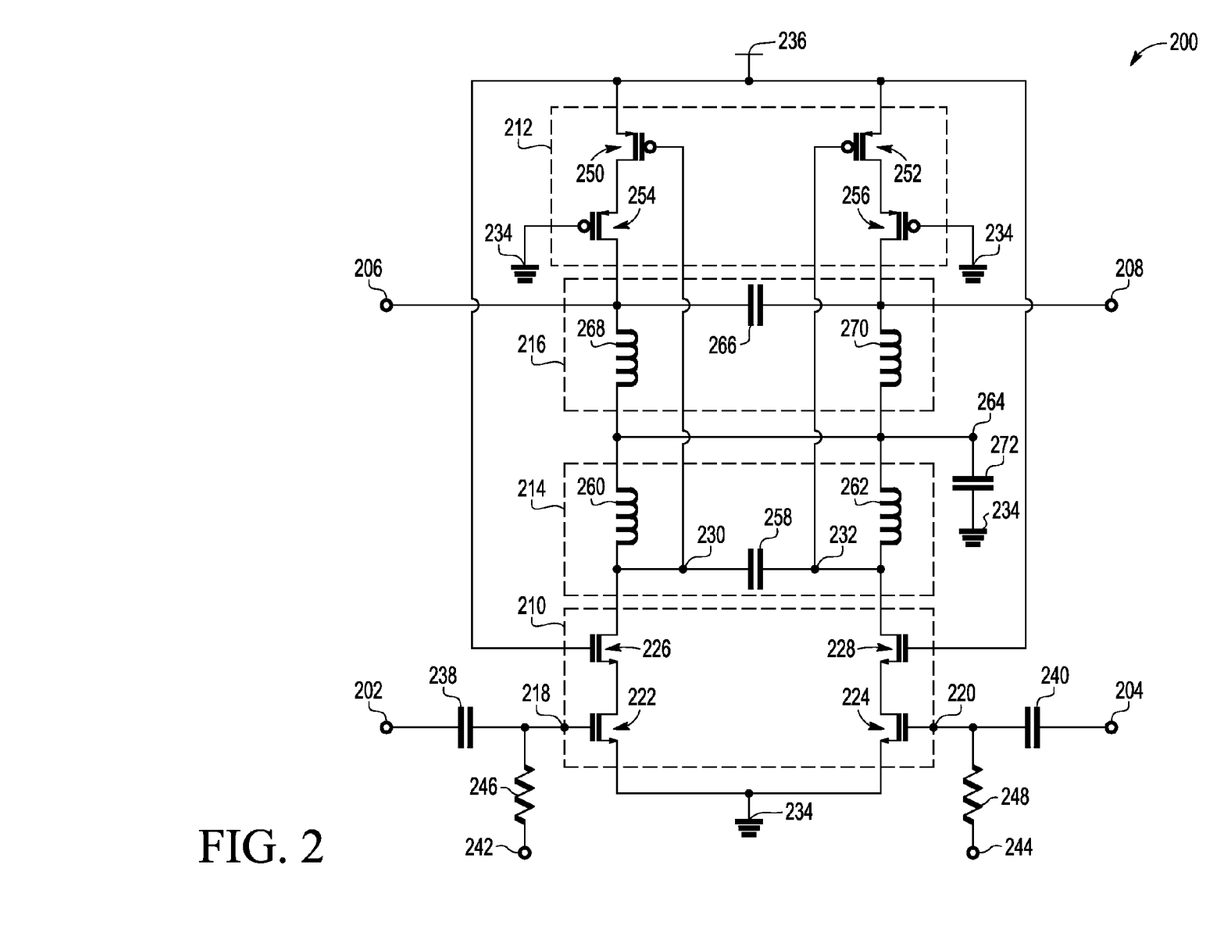
FIG. 2 is a schematic view of an amplifier module suitable for use in the receiver system of FIG. 1 in accordance with one embodiment of the invention.

FIG. 2 depicts an exemplary embodiment of amplifier circuitry 200 suitable for use as the amplifier circuitry 108 in the receiver system 100 of FIG. 1. The amplifier circuitry 200 includes a pair of differential input nodes 202, 204, a pair of differential output nodes 206, 208, an input amplification stage 210 coupled to the differential input nodes 202, 204, an output amplification stage 212 coupled to the differential output nodes 206, 208, a first tank circuit 214 coupled to the output of the input amplification stage 210, and a second tank circuit 216 coupled to the output of the output amplification stage 212. In an exemplary embodiment, the amplification stages 210, 212 are each realized as common-source transconductance amplification stages that are stacked, cascaded, or otherwise configured between a reference voltage nodes 234, 236, such that DC current flows between the reference voltage nodes 234, 236 through the amplification stages 210, 212 in series, as described in greater detail below.

It should be understood that FIG. 2 is a simplified representation of the amplifier circuitry 200 for purposes of explanation and ease of description, and FIG. 2 is not intended to limit the application or scope of the subject matter in any way. In this regard, it should be noted that although FIG. 2 depicts an implementation using n-type MOSFETs (e.g., NMOS) for the input amplification stage 210 and p-type MOSFETs (e.g., PMOS) for the output amplification stage 212, numerous equivalent circuits may be implemented (e.g., using a PMOS input amplification stage and an NMOS output amplification stage). Accordingly, for convenience, but without limitation, the input amplification stage 210 is alternatively referred to herein as the NMOS amplification stage and the output amplification stage 212 is alternatively referred to herein as the PMOS amplification stage. Additionally, although FIG. 2 depicts direct electrical connections between circuit elements and/or terminals, alternative embodiments may employ intervening circuit elements and/or components while functioning in a substantially similar manner.

In an exemplary embodiment, the NMOS amplification stage 210 has differential inputs 218, 220 coupled to the differential input nodes 202, 204, and the NMOS amplification stage 210 is configured to generate an amplified version of the input differential electrical signals at its differential inputs 218, 220 at differential outputs 230, 232, as described in greater detail below. As illustrated in FIG. 2, the NMOS amplification stage 210 includes a first NMOS transistor 222 coupled to the first NMOS amplification stage input node 218, a second NMOS transistor 224 coupled to a second NMOS amplification stage input node 220, a third NMOS transistor 226 coupled between a first NMOS amplification stage output node 230 and the first NMOS transistor 222, and a fourth NMOS transistor 228 coupled between a second NMOS amplification stage output node 232 and the second NMOS transistor 224. As illustrated, the first and third NMOS transistors 222, 226 are configured as a first transistor stack coupled between the first NMOS amplification stage output node 230 and a reference voltage node 234 configured to receive a ground reference voltage for the amplifier circuitry 200 and the second and fourth NMOS transistors 224, 228 are configured as a second transistor stack coupled between the second NMOS amplification stage output node 232 and the ground reference voltage node 234. As used herein, "transistor stack," "stacking transistors," "stacked transistors," or equivalents thereof, should be understood to describe the configuration where a terminal of one transistor device is coupled to the a terminal of another transistor device, such that the current passes through the transistor devices in series (e.g., the same current through each transistor device).

As illustrated in FIG. 2, the drain terminal of the third NMOS transistor 226 is connected to the first NMOS amplification stage output node 230, the source terminal of the third NMOS transistor 226 is connected to the drain terminal of the first NMOS transistor 222, and the source terminal of the first NMOS transistor 222 is connected to the ground reference voltage node 234 such that current flows between the first NMOS amplification stage output node 230 and the ground reference voltage node 234 in series. The third NMOS transistor 226 reduces the interaction between the impedance at the first NMOS amplification stage output node 230 and the impedance at the first NMOS amplification stage input node 218 and reduces Miller effects due to the gate-drain capacitance of the first NMOS transistor 222. Similarly, the drain terminal of the fourth NMOS transistor 228 is connected to the second NMOS amplification stage output node 232, the source terminal of the fourth NMOS transistor 228 is connected to the drain terminal of the second NMOS transistor 224, and the source terminal of the second NMOS transistor 224 is connected to the ground reference voltage node 234. In this manner, the source terminals of NMOS transistors 222, 224 are connected to one another at the ground reference voltage node 234 to provide a common source for the NMOS amplification stage 210. As described above, the fourth NMOS transistor 228 reduces the interaction between the impedance at the second NMOS amplification stage output node 232 and the impedance at the second NMOS amplification stage input node 220 and reduces Miller effects due to the gate-drain capacitance of the second NMOS transistor 224.

In an exemplary embodiment, the gate terminals of the third and fourth NMOS transistors 226, 228 are each connected to a reference voltage node 236 configured to receive a positive reference voltage (or supply voltage) for the amplifier circuitry 200 such that the third and fourth NMOS transistors 226, 228 are biased on in the saturation region. The gate terminal of the first NMOS transistor 222 is connected to the first differential input node 218 of the NMOS amplification stage 210, which in turn, is configured to receive a first component of a differential electrical signal that is provided to the amplifier circuitry 200 (e.g., from balun 106) at the first differential input node 202. In an exemplary embodiment, a first capacitor 238 is connected electrically in series between the differential input node 202 and the NMOS amplification stage input node 218 and functions as a high-pass filter that removes low frequency components from the input signal at the differential input node 202 without attenuating components of the input signal at or near the carrier frequency for the signals received by the antenna 102. Similarly, the gate terminal of the second NMOS transistor 224 is connected to the second differential input node 220 of the NMOS amplification stage 210, which in turn, is coupled to the differential input node 204 via a capacitor 240 connected electrically in series between the differential input node 204 and the second differential input node 220 of the NMOS amplification stage 210.

In an exemplary embodiment, a respective resistance element 246, 248 is coupled between each NMOS amplification stage input node 218, 220 and a respective node 242, 244 configured to receive a bias voltage for the NMOS amplification stage 210. In this regard, the bias voltages at nodes 242, 244 are chosen to bias the voltage at the NMOS amplification stage input nodes 218, 220 to voltage greater than the threshold voltage of the first and second NMOS transistors 222, 224 to thereby bias the first and second NMOS transistors 222, 224 on in the saturation region. By biasing the NMOS transistors 222, 224, 226, 228 of the NMOS amplification stage 210 in the saturation region, the first transistor stack comprised of NMOS transistors 222, 226 generates a first component of the amplified differential signal produced by the NMOS amplification stage 210 by amplifying the component of the differential electrical signal received at the first NMOS amplification stage input node 218 and producing the result at the first NMOS amplification stage output node 230, and the second transistor stack comprised of NMOS transistors 224, 228 generates a second component of the amplified differential signal by amplifying the component of the differential electrical signal received at the second NMOS amplification stage input node 220 and producing the result at the second NMOS amplification stage output node 232. Additionally, the voltages at bias voltage nodes 242, 244 may be adjusted to control the amount of current that flows through the NMOS transistors 222, 224, and thereby, control the amount of current consumed by the amplifier circuitry 200, as described in greater detail below. In an exemplary embodiment, the bias voltages at nodes 242, 244 are configured such that the total current consumption for the amplifier circuitry 200 is less than 4 mA.

In an exemplary embodiment, the PMOS amplification stage 212 has differential inputs coupled to the NMOS amplification stage output nodes 230, 232, and the PMOS amplification stage 212 is configured to amplify the previously amplified differential electrical signals at the NMOS amplification stage output nodes 230, 232 to obtain an amplified differential output signal at the differential output nodes 206, 208, as described in greater detail below. As illustrated in FIG. 2, the PMOS amplification stage 212 includes a first PMOS transistor 250 coupled to the first NMOS amplification stage output node 230, a second PMOS transistor 252 coupled to the second NMOS amplification stage output node 232, a third PMOS transistor 254 coupled between the first PMOS transistor 250 and the first differential output node 206, and a fourth PMOS transistor 256 coupled between the second differential output node 208 and the second PMOS transistor 252. As illustrated, the first and third PMOS transistors 250, 254 are configured as a transistor stack coupled between the supply reference voltage node 236 and the first differential output node 206 and the second and fourth PMOS transistors 252, 256 are configured as a transistor stack coupled between the supply reference voltage node 236 and the second differential output node 208. As illustrated in FIG. 2, the source terminal of the first PMOS transistor 250 is connected to the supply reference voltage node 236, the drain terminal of the first PMOS transistor 250 is connected to the source terminal of the third PMOS transistor 254, and the drain terminal of the third PMOS transistor 254 is connected to the first differential output node 206. Similarly, the source terminal of the second PMOS transistor 252 is connected to the supply reference voltage node 236, the drain terminal of the second PMOS transistor 252 is connected to the source terminal of the fourth PMOS transistor 256, and the drain terminal of the fourth PMOS transistor 256 is connected to the second differential output node 208. In this manner, the source terminals of PMOS transistors 250, 252 are connected to one another at the supply reference voltage node 236 to provide a common source for the PMOS amplification stage 212. As described above, the third PMOS transistor 254 reduces the interaction between the impedance at the first NMOS amplification stage output node 230 and the impedance at the differential output node 206 and reduces Miller effects due to the gate-drain capacitance of the first PMOS transistor 250, and the fourth PMOS transistor 256 reduces the interaction between the impedance at the second NMOS amplification stage output node 232 and the impedance at the second differential output node 208 and reduces Miller effects due to the gate-drain capacitance of the second PMOS transistor 252.

In an exemplary embodiment, the gate terminals of the third and fourth PMOS transistors 254, 256 are each connected to the ground reference voltage node 234, such that the third and fourth PMOS transistors 254, 256 are biased on in the saturation region. The gate terminal of the first PMOS transistor 250 is connected to the first NMOS amplification stage output node 230 and the gate terminal of the second PMOS transistor 252 is connected to the second NMOS amplification stage output node 232. The first and second PMOS transistors 250, 252 are biased on in the saturation region, as described in greater detail below. By virtue of the PMOS transistors 250, 252, 254, 256 of the PMOS amplification stage 212 being biased in the saturation region, the transistor stack comprised of PMOS transistors 250, 254 generates a first component of the amplified differential output signal at the first differential output node 206 by amplifying the component of the amplified differential signal produced by the NMOS amplification stage 210 at the first NMOS amplification stage output node 230, and the transistor stack comprised of PMOS transistors 252, 256 generates a second component of the amplified differential output signal at the second differential output node 208 by amplifying the component of the amplified differential signal produced by the NMOS amplification stage 210 at the second NMOS amplification stage output node 232.

In an exemplary embodiment, the first tank circuit 214 includes a capacitive element 258 connected between the NMOS amplification stage output nodes 230, 232, a first inductive element 260 connected between the first NMOS amplification stage output node 230 and an alternating current (AC) ground reference voltage node 264, and a second inductive element 262 connected between the second NMOS amplification stage output node 232 and the AC ground reference voltage node 264. Similarly, the second tank circuit 216 includes a capacitive element 266 connected between the PMOS amplification stage output nodes 206, 208, an inductive element 268 connected between the first PMOS amplification stage output node 206 and the AC ground reference voltage node 264, and another inductive element 270 connected between the second PMOS amplification stage output node 208 and the AC ground reference voltage node 264.

In an exemplary embodiment, a capacitive element 272 is connected between the AC ground reference voltage node 264 and the ground reference voltage node 234. In this regard, the capacitance of the capacitive element 272 is chosen such that the voltage at the AC ground reference voltage node 264 corresponds to a virtual ground reference voltage for the alternating current electrical signals at the differential output nodes 206, 208, 230, 232 of the amplification stages 210, 212, and thereby, effectively isolates or otherwise separates the output of NMOS amplification stage 210 and the output of the PMOS amplification stage 212.

Still referring to FIG. 2, the inductances of the inductive elements 260, 262 and the capacitance of the capacitive element 258 are chosen to provide a resonant frequency for the NMOS amplification stage 210 (e.g., 2 poles in the transfer function for the gain of the NMOS amplification stage 210). In this regard, the resonant frequency provided by the first tank circuit 214 is governed by the equation $$\omega = \frac{1}{\sqrt{LC}},$$

where L is the sum of the inductances of the inductive elements 260, 262, C is the sum of the capacitance of the capacitive element 258, the parasitic capacitances of NMOS transistors 226, 228 and the effective capacitance of the PMOS amplification stage 212 at the NMOS amplification stage output nodes 230, 232, and ω is the resonant frequency in radians. Similarly, the inductances of the inductive elements 268, 270 and the capacitance of the capacitive element 266 are chosen to provide a resonant frequency for the PMOS amplification stage 212. Additionally, it should be noted that the gain of a respective amplification stage 210, 212 may be increased at the resonant frequency provided by its respective tank circuit 214, 216 by increasing the quality factor of the inductive elements 260, 262, 268, 270 of its respective tank circuit 214, 216. As described in greater detail below, in accordance with one embodiment, for a carrier frequency of 2.45 GHz, the capacitance of the capacitive element 272 is equal to about 160 picofarads, wherein to obtain a relatively flat gain response at or around the 2.45 GHz carrier frequency, the inductances of the inductive elements 260, 262 are equal to about 3.74 nanohenries and the capacitance of the capacitive element 258 is equal to about 448 femtofarads to provide a resonant frequency for the NMOS amplification stage 210 of about 2 GHz, and the inductances of the inductive elements 268, 270 are equal to about 3.74 nanohenries and the capacitance of the capacitive element 266 is equal to about 224 femtofarads to provide a resonant frequency for the PMOS amplification stage 212 of about 3 GHz.

One advantage of the amplifier circuitry 200 of FIG. 2 is that the resonant frequencies of tank circuits 214, 216 may be chosen to provide a relatively high gain over a relatively wide bandwidth. In this regard, the inductances of the inductive elements 268, 270 and the capacitance of the capacitive element 266 are chosen to provide a resonant frequency for the PMOS amplification stage 212 that is different from the resonant frequency for the NMOS amplification stage 210. For example, when used in the receiver system 100 of FIG. 1, the impedance matching circuitry 104 is configured to maximize the gain of the amplifier circuitry 108, 200 to the carrier frequency of the signals received by the antenna 102. In accordance with one embodiment, the first tank circuit 214 is configured to provide a resonant frequency for the NMOS amplification stage 210 that is less than the carrier frequency and the second tank circuit 216 is configured to provide a resonant frequency for the PMOS amplification stage 212 that is greater than the carrier frequency. As a result, the amplifier circuitry 108, 200 is capable of achieving a relatively flat gain response from the lower resonant frequency of the NMOS amplification stage 210 to the higher resonant frequency of the PMOS amplification stage 212. For example, if the carrier frequency for the electromagnetic signals received by the antenna 102 is 2.45 GHz, the impedance matching circuitry 104 may be configured to match the impedance of the antenna 102 at 2.45 GHz, the first tank circuit 214 may be configured to provide a resonant frequency for the NMOS amplification stage 210 of about 2 GHz, and the second tank circuit 216 may be configured to provide a resonant frequency for the PMOS amplification stage 212 of about 3 GHz, such that the amplifier circuitry 108, 200 achieves a relatively flat gain response for input signals between 2 GHz and 3 GHz. In this manner, the amplifier circuitry 200 is capable of achieving relatively high gain across a relatively wide bandwidth.

Another advantage of the amplifier circuitry 200 of FIG. 2 is that the amplifier circuitry 200 is capable of achieving relatively high gain with reduced current consumption by virtue of the current being shared among the amplification stages 210, 212. In this regard, the PMOS amplification stage 212 and the NMOS amplification stage 210 are stacked between the supply reference voltage node 236 and the ground reference voltage node 234 such that DC current flows through the amplification stages 210, 212 between the supply reference voltage node 236 and the ground reference voltage node 234 in series. For example, at zero frequency (i.e., DC), the inductive elements 260, 262, 268, 270 are effectively short-circuits and the capacitive elements 258, 266, 272 are effectively open-circuits. In this manner, at DC (or low frequencies) the PMOS transistor stack comprised of transistors 250, 254 and the NMOS transistor stack comprised of transistors 222, 226 are effectively stacked or cascaded, and the same DC current flows through transistors 222, 226, 250, 254 and inductive elements 260, 268. Similarly, the PMOS transistor stack comprised of transistors 252, 256 and the NMOS transistor stack comprised of transistors 224, 228 are stacked or cascaded, and the same DC current flows through transistors 224, 228, 252, 256 and inductive elements 262, 270. By virtue of the DC current being shared and utilized equally by the two amplification stages 210, 212, the DC current consumed by one amplification stage is effectively reused by the other amplification stage, thereby reducing the total amount of current that needs to be consumed by the amplifier circuitry 200 to achieve desired performance targets. As described above, the total amount of current consumed by the amplifier circuitry 200 is controlled by the bias voltages at bias voltage nodes 242, 244 which control the amount of current that flows through the NMOS transistors 222, 224.

Yet another advantage of the amplifier circuitry 200 of FIG. 2 is that the PMOS amplification stage 212 is biased in the saturation region without the need for additional biasing circuitry. As described above, the gate terminal of PMOS transistors 254, 256 are connected to the ground reference voltage node 234, which results in the DC voltage at the drain terminals of the PMOS transistors 254, 256 being substantially equal to the DC voltage at source terminal of the PMOS transistors 254, 256. Because there is substantially zero DC voltage across the inductive elements 260, 262, 268, 270 (i.e., because the inductive elements 260, 262, 268, 270 are effectively short-circuits at DC), the DC voltage at the drain terminals of PMOS transistors 250, 252 is substantially equal to the DC voltage at the gate terminals of PMOS transistors 250, 252. As a result, the PMOS transistors 250, 252 are operated in the saturation region.

For the sake of brevity, conventional techniques related to low-noise amplifiers, analog circuit design, field-effect transistors (FETs), and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In conclusion, systems, devices, and apparatus configured in accordance with exemplary embodiments of the invention relate to:

An embodiment for an amplifier circuit is provided. The amplifier circuit includes a first common-source amplification stage having a first amplification stage output, the first common-source amplification stage being configured to generate a first amplified signal at the first amplification stage output, and a second common-source amplification stage having a second amplification stage input and a second amplification stage output. The second amplification stage input is coupled to the first amplification stage output, and the second common-source amplification stage generates a second amplified signal at the second amplification stage output based on the first amplified signal. The first common-source amplification stage is coupled to a first reference voltage node, the second common-source amplification stage is coupled to a second reference voltage node, and the first common-source amplification stage and the second common-source amplification stage are configured such that a current between the first reference voltage node and the second reference voltage node flows in series through the first common-source amplification stage and the second common-source amplification stage. In one embodiment, the amplifier circuit includes a first tank circuit coupled between the first amplification stage output and a third reference voltage node, and a second tank circuit coupled between the second amplification stage output and the third reference voltage node, wherein the current between the first reference voltage node and the second reference voltage node flows in series through the first tank circuit and the second tank circuit. In another embodiment, the first tank circuit is configured to provide a first resonant frequency for the first common-source amplification stage and the second tank circuit is configured to provide a second resonant frequency for the second amplification stage, wherein the first resonant frequency and the second resonant frequency are different. In yet another embodiment, the amplifier circuit includes a capacitive element coupled between the third reference voltage node and the first reference voltage node. In accordance with one embodiment, the first common-source amplification stage comprises a NMOS transconductance amplification stage having a common source coupled to the first reference voltage node, and the second common-source amplification stage comprises a PMOS transconductance amplification stage having a common source coupled to the second reference voltage node.

In yet another embodiment, the first common-source amplification stage includes a first transistor stack coupled between the first amplification stage output and the first reference voltage node, and the second common-source amplification stage includes a second transistor stack coupled between the second reference voltage node and the second amplification stage output, wherein the current between the first reference voltage node and the second reference voltage node flows in series through the first transistor stack and the second transistor stack. In a further embodiment, the first transistor stack includes a first transistor having a source terminal connected to the first reference voltage node, a gate terminal configured to receive a first input signal, and a drain terminal, and a second transistor having a source terminal connected to the drain terminal of the first transistor, a gate terminal connected to the second reference voltage node, and a drain terminal connected to a first node of the first amplification stage output. The second transistor stack includes a third transistor having a source terminal connected to the second reference voltage node, a gate terminal connected to the first amplification stage output, and a drain terminal, and a fourth transistor having a source terminal connected to the drain terminal of the third transistor, a gate terminal connected to the first reference voltage node, and a drain terminal connected to the second amplification stage output. The first common-source amplification stage is configured to generate a first component of the first amplified signal at the first node based on the first input signal, and the second common-source amplification stage is configured to generate a first component of the second amplified signal at a first node of the second amplification stage output based on the first component of the first amplified signal. In one embodiment, the first and second transistors are NMOS transistors and the third and fourth transistors are PMOS transistors. In yet another embodiment, the first common-source amplification stage includes a fifth transistor having a source terminal connected to the first reference voltage node, a gate terminal configured to receive a second input signal, and a drain terminal, a sixth transistor having a source terminal connected to the drain terminal of the fifth transistor, a gate terminal connected to the second reference voltage node, and a drain terminal connected to a second node of the first amplification stage output. The second common-source amplification stage includes a seventh transistor having a source terminal connected to the second reference voltage node, a gate terminal connected to the second node of the first amplification stage output, and a drain terminal, and an eighth transistor having a source terminal connected to the drain terminal of the seventh transistor, a gate terminal connected to the first reference voltage node, and a drain terminal connected to a second node of the second amplification stage output. The first common-source amplification stage is configured to generate a second component of the first amplified signal at the second node of the first amplification stage output based on the second input signal, and the second common-source amplification stage is configured to generate a second component of the second amplified signal at the second node of the second amplification stage output based on the second component of the first amplified signal. In a further embodiment, a first inductive element is connected between the first node of the first amplification stage output and a third reference voltage node, a second inductive element is connected between the second node of the first amplification stage output and the third reference voltage node, a first capacitive element is connected between the first node of the first amplification stage output and the second node of the first amplification stage output, a third inductive element is connected between the first node of the second amplification stage output and the third reference voltage node, a fourth inductive element is connected between the second node of the second amplification stage output and the third reference voltage node, a second capacitive element is connected between the first node of the second amplification stage output and the second node of the second amplification stage output, and a third capacitive element connected between the third reference voltage node and the first reference voltage node.

In accordance with another embodiment, an apparatus for an amplifier circuit includes a first transistor having a source terminal connected to a first reference voltage node, a gate terminal connected to a first input node, and a drain terminal; a second transistor having a source terminal connected to the drain terminal of the first transistor, a gate terminal connected to a second reference voltage node, and a drain terminal; a third transistor having a source terminal connected to the second reference voltage node, a gate terminal connected to the drain terminal of the second transistor, and a drain terminal; and a fourth transistor having a source terminal connected to the drain terminal of the third transistor, a gate terminal connected to the first reference voltage node, and a drain terminal connected to a first output node. In one embodiment, the first and second transistors are N-type transistors, and the third and fourth transistors are P-type transistors. In another embodiment, the amplifier circuit includes a first tank circuit coupled between the drain terminal of the second transistor and a third reference voltage node and a second tank circuit coupled between the drain terminal of the fourth transistor and the third reference voltage node. In a further embodiment, a first capacitive element is coupled between the third reference voltage node and the first reference voltage node. In yet another embodiment, the amplifier circuit further comprises a fifth transistor having a source terminal connected to the first reference voltage node, a gate terminal connected to a second input node, and a drain terminal; a sixth transistor having a source terminal connected to the drain terminal of the fifth transistor, a gate terminal connected to the second reference voltage node, and a drain terminal, the first tank circuit being coupled between the drain terminal of the sixth transistor and the third reference voltage node; a seventh transistor having a source terminal connected to the second reference voltage node, a gate terminal connected to the drain terminal of the sixth transistor, and a drain terminal; and an eighth transistor having a source terminal connected to the drain terminal of the seventh transistor, a gate terminal connected to the first reference voltage node, and a drain terminal connected to a second output node, the second tank circuit being coupled between the drain terminal of the eighth transistor and the third reference voltage node. In accordance with one embodiment, the first tank circuit includes a first inductive element connected between the drain terminal of the second transistor and the third reference voltage node, a second inductive element connected between the drain terminal of the sixth transistor and the third reference voltage node, and a second capacitive element connected between the drain terminal of the second transistor and the drain terminal of the sixth transistor. The second tank circuit includes a third inductive element connected between the drain terminal of the fourth transistor and the third reference voltage node, a fourth inductive element connected between the drain terminal of the eighth transistor and the third reference voltage node, and a third capacitive element connected between the drain terminal of the fourth transistor and the drain terminal of the eighth transistor. In one embodiment, the first, second, fifth, and sixth transistors are N-type transistors, and the third, fourth, seventh, and eighth transistors are P-type transistors.

In yet another embodiment, a receiver system is provided. The receiver system includes an antenna configured to generate an electrical signal in response to an electromagnetic signal and amplifier circuitry configured to generate an output signal representative of the electrical signal. The amplifier circuitry includes a first common-source amplification stage configured to generate a first amplified signal based on an input signal representative of the electrical signal, and a second common-source amplification stage coupled to the first common-source amplification stage, the second common-source amplification stage being configured to generate the output signal based on the first amplified signal. The first common-source amplification stage and the second common-source amplification stage are stacked such that a direct current flows in series through the first common-source amplification stage and the second common-source amplification stage. In one embodiment, the amplifier circuitry further includes a first tank circuit coupled to the first common-source amplification stage and a second tank circuit coupled to the second common-source amplification stage. The first tank circuit is configured to provide a first resonant frequency for the first common-source amplification stage that is less than a carrier frequency of the electromagnetic signal, and the second tank circuit is configured to provide a second resonant frequency for the second common-source amplification stage that is greater than the carrier frequency of the electromagnetic signal.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier circuit comprising:
a first transistor having a source terminal connected to a first reference voltage node, a gate terminal connected to a first input node, and a drain terminal;
a second transistor having a source terminal connected to the drain terminal of the first transistor, a gate terminal connected to a second reference voltage node, and a drain terminal;
a third transistor having a source terminal connected to the second reference voltage node, a gate terminal connected to the drain terminal of the second transistor, and a drain terminal; and
a fourth transistor having a source terminal connected to the drain terminal of the third transistor, a gate terminal connected to the first reference voltage node, and a drain terminal connected to a first output node.

2. The amplifier circuit of claim 1, wherein:
the first transistor comprises a first N-type transistor;
the second transistor comprises a second N-type transistor;
the third transistor comprises a first P-type transistor; and
the fourth transistor comprises a second P-type transistor.

3. The amplifier circuit of claim 1, further comprising:
a first tank circuit coupled between the drain terminal of the second transistor and a third reference voltage node; and
a second tank circuit coupled between the drain terminal of the fourth transistor and the third reference voltage node.

4. The amplifier circuit of claim 3, wherein:
the first tank circuit is configured to provide a first resonant frequency;
the second tank circuit is configured to provide a second resonant frequency; and
the first resonant frequency and the second resonant frequency are different.

5. The amplifier circuit of claim 3, wherein:
the first tank circuit is configured to provide a first resonant frequency that is less than a carrier frequency; and
the second tank circuit being configured to provide a second resonant frequency that is greater than the carrier frequency.

6. The amplifier circuit of claim 3, wherein:
the first tank circuit comprises a first inductive element connected between the drain terminal of the second transistor and the third reference voltage node; and the second tank circuit comprises a second inductive element connected between the drain terminal of the fourth transistor and the third reference voltage node.

7. The amplifier circuit of claim 3, wherein current between the first reference voltage node and the second reference voltage node flows in series through the first tank circuit and the second tank circuit.

8. The amplifier circuit of claim 3, further comprising a capacitive element coupled between the third reference voltage node and the first reference voltage node.

9. The amplifier circuit of claim 8, wherein the capacitive element is configured to provide a virtual ground reference voltage for an alternating current electrical signal at the first output node.

10. The amplifier circuit of claim 3, further comprising a first capacitive element coupled between the third reference voltage node and the first reference voltage node.

11. The amplifier circuit of claim 10, further comprising
a fifth transistor having a source terminal connected to the first reference voltage node, a gate terminal connected to a second input node, and a drain terminal;
a sixth transistor having a source terminal connected to the drain terminal of the fifth transistor, a gate terminal connected to the second reference voltage node, and a drain terminal, the first tank circuit being coupled between the drain terminal of the sixth transistor and the third reference voltage node;
a seventh transistor having a source terminal connected to the second reference voltage node, a gate terminal connected to the drain terminal of the sixth transistor, and a drain terminal; and
an eighth transistor having a source terminal connected to the drain terminal of the seventh transistor, a gate terminal connected to the first reference voltage node, and a drain terminal connected to a second output node, the second tank circuit being coupled between the drain terminal of the eighth transistor and the third reference voltage node.

12. The amplifier circuit of claim 11, wherein:
the first tank circuit comprises:
    a first inductive element connected between the drain terminal of the second transistor and the third reference voltage node;
    a second inductive element connected between the drain terminal of the sixth transistor and the third reference voltage node; and
    a second capacitive element connected between the drain terminal of the second transistor and the drain terminal of the sixth transistor; and
the second tank circuit comprises:
    a third inductive element connected between the drain terminal of the fourth transistor and the third reference voltage node;
    a fourth inductive element connected between the drain terminal of the eighth transistor and the third reference voltage node; and
    a third capacitive element connected between the drain terminal of the fourth transistor and the drain terminal of the eighth transistor.

13. The amplifier circuit of claim 12, wherein:
the first transistor comprises a first N-type transistor;
the second transistor comprises a second N-type transistor;
the fifth transistor comprises a third N-type transistor;
the sixth transistor comprises a fourth N-type transistor;
the third transistor comprises a first P-type transistor;
the fourth transistor comprises a second P-type transistor;
the seventh transistor comprises a third P-type transistor; and
the eighth transistor comprises a fourth P-type transistor.

14. The amplifier circuit of claim 1, wherein:
the first transistor and the second transistor are configured as a first transistor stack coupled between a first amplification stage output and the first reference voltage node;
the third transistor and the fourth transistor are configured as a second transistor stack coupled between the second reference voltage node and the first output node; and
current between the first reference voltage node and the second reference voltage node flows in series through the first transistor stack and the second transistor stack.

15. A receiver system comprising:
an antenna configured to generate an electrical signal in response to an electromagnetic signal; and
the amplifier circuit of claim 1, wherein the amplifier circuit is configured to generate an output signal representative of the electrical signal at the first output node based on an input signal representative of the electrical signal at the first input node.

16. The receiver system of claim 15, wherein the amplifier circuit comprises:
a first tank circuit coupled between the drain terminal of the second transistor and a third reference voltage node, the first tank circuit being configured to provide a first resonant frequency that is less than a carrier frequency of the electromagnetic signal; and
a second tank circuit coupled between the drain terminal of the fourth transistor and the third reference voltage node, the second tank circuit being configured to provide a second resonant frequency that is greater than the carrier frequency of the electromagnetic signal.

17. The receiver system of claim 16, wherein the carrier frequency is 2.45 GHz.

18. An amplifier circuit comprising:
a first common-source amplification stage including a first transistor stack coupled between a first amplification stage output and a first reference voltage node, the first transistor stack comprising:
    a first transistor having a source terminal connected to the first reference voltage node, a gate terminal connected to a input node, and a drain terminal;
    a second transistor having a source terminal connected to the drain terminal of the first transistor, a gate terminal connected to a second reference voltage node, and a drain terminal; and
a second common-source amplification stage including a second transistor stack coupled between the second reference voltage node and an output node, the second transistor stack comprising:
    a third transistor having a source terminal connected to the second reference voltage node, a gate terminal connected to the drain terminal of the second transistor, and a drain terminal; and
    a fourth transistor having a source terminal connected to the drain terminal of the third transistor, a gate terminal connected to the first reference voltage node, and a drain terminal connected to the output node.

19. The amplifier circuit of claim 18, wherein a current between the first reference voltage node and the second reference voltage node flows in series through the first common-source amplification stage and the second common-source amplification stage.

20. The amplifier circuit of claim 18, wherein:
the first common-source amplification stage includes a third transistor stack comprising:

a fifth transistor having a source terminal connected to the first reference voltage node, a gate terminal connected to a second input node, and a drain terminal; and a sixth transistor having a source terminal connected to the drain terminal of the fifth transistor, a gate terminal connected to the second reference voltage node, and a drain terminal; and the second common-source amplification stage includes a fourth transistor stack comprising:

a seventh transistor having a source terminal connected to the second reference voltage node, a gate terminal connected to the drain terminal of the sixth transistor, and a drain terminal; and an eighth transistor having a source terminal connected to the drain terminal of the seventh transistor, a gate terminal connected to the first reference voltage node, and a drain terminal connected to a second output node.

* * * * *